United States Patent [19]

Burr

[11] 4,097,684
[45] Jun. 27, 1978

[54] ELECTRIC WIRING ASSEMBLIES

[75] Inventor: Robert Page Burr, Huntington, N.Y.

[73] Assignee: Kollmorgen Technologies Inc., Dallas, Tex.

[21] Appl. No.: 513,190

[22] Filed: Oct. 8, 1974

Related U.S. Application Data

[60] Continuation of Ser. No. 209,626, Dec. 20, 1971, abandoned, and Ser. No. 344,111, Mar. 23, 1973, abandoned, which is a division of Ser. No. 10,039, Feb. 9, 1970, Pat. No. 3,646,572.

[51] Int. Cl.² .............................................. H05K 1/00
[52] U.S. Cl. .................................... 174/68.5; 361/397
[58] Field of Search .................. 174/68.5; 317/101 B, 317/101 C, 101 CC, 101 CM, 101 CE; 29/624, 625, 626; 339/17 C, 17 E

[56] References Cited

U.S. PATENT DOCUMENTS

| 2,066,876 | 1/1937 | Carpenter et al. | 174/68.5 UR |
| 3,157,733 | 11/1964 | Demasi | 174/68.5 |
| 3,191,100 | 6/1965 | Sorvillo | 317/101 CM |
| 3,247,314 | 4/1966 | Mittendorf | 174/68.5 |
| 3,277,347 | 10/1966 | Ecker | 317/101 CE |
| 3,701,838 | 10/1972 | Olney, Jr. | 174/68.5 |
| 3,713,947 | 1/1973 | Hawkins | 174/68.5 UR |

Primary Examiner—Arthur T. Grimley

[57] ABSTRACT

This invention generally relates to prefabricated electric wire assemblies comprising an interconnected network of separately formed, integral, shaped conductors, and to materials and techniques used in the manufacture of such assemblies.

3 Claims, 3 Drawing Figures

ELECTRIC WIRING ASSEMBLIES

This application is a continuation of application Ser. No. 209,626, filed Dec. 20, 1971 and application Ser. No. 344,111, filed Mar. 23, 1973, both now abandoned, and in turn is a division of application Ser. No. 10039, filed Feb. 9, 1970, now U.S. Pat. No. 3,646,572, dated Feb. 9, 1972.

SUMMARY

It is standard practice in the art to produce electrical wiring assemblies on an automatic or semi-automatic basis using the photographic techniques described for example in U.S. Pat. No. 2,587,568. In the manufacture of such assemblies, commonly referred to as printed circuit boards, electrical conductors are produced in situ upon an insulating support by a process based on the printing of a representation or pattern of conducting metal.

Typically, printed circuit board manufacture involves the steps of preparing by any of the well-known methods of the printing art, a printing plate for printing a representation of the metal electric conductors of the circuit component or a part of them; making an imprint by the aid of the printing plate upon a surface thereby differentiating on that surface the areas which are required to be conductive from the areas which are required to be non-conductive; and from that imprint producing the conductor by subjecting the printed surface to treatment which operates differently on the areas of the surface differentiated by the printing, thereby changing the differentiation into a differentiation of conductive and non-conductive areas.

The development of the conductor from the imprint is in most cases effected by methods adapted from the printing art or analogous to the methods of the printing art, such as etching, bronzing, electro-deposition and the like.

In printed circuit board manufacture, much time, effort and expense are involved in the layout of circuit pattern drawings and/or the photographic work involved in producing an imprint of the pattern upon the insulation panel. As a result, the cost of a metallized conductor produced in situ on an insulating base by conventional printed circuit teachings tends to be high, compared to the cost of more traditional, separately formed electrical conductors such as drawn metal wire.

According to this invention, prefabricated electrical wiring assemblies are provided which are in all respects comparable to printed circuit boards but which are made in whole or in part with traditional, separately formed metal conductors such as drawn wire, thereby avoiding in whole or in part many of the costs associated with in situ production of metallized conductors on an insulating base by the printing techniques heretofore employed.

DETAILED DESCRIPTION

An object of the invention is to provide improved prefabricated electric wiring assemblies, such as interconnecting networks or circuit connections for radio and television apparatus, windings for transformers and dynamo electric machines, connecting networks for switchboards, computers and electric wiring terminal boards generally.

A further object of the invention is to provide prefabricated electric wiring assemblies comprising separately formed, integral, shaped metal conductors which serve to conduct electric current.

Another object of the invention is to provide a prefabricated electric wiring board comprising separately formed, integral and shaped metal conductors and electrical interconnections between the conductors and the exterior of the board.

Other objects and advantages of the invention will be set forth in part herein and in part will be obvious herefrom or may be learned by practice with the invention, the same being realized and attained by means of the instrumentalities and combinations as pointed out in the appended claims.

The invention consists in the novel parts, constructions, arrangements, combinations, steps and improvements herein shown and described.

In a preferred embodiment, the wire assemblies of this invention comprise a plurality of separately formed, integral and shaped conductors arranged in accordance with a pre-determined pattern and bonded to or encapsulated within an insulating base and extending between conducting points in the base such that the wire ends terminate or start at the posts. The posts contact with adjacent wire ends, thereby electrically connecting the conductors to one another and/or to the exterior of the base.

The term conductor as used herein refers to separately formed, integral, shaped pieces of metal capable of conducting electricity. The metal pieces may take the shape of wire, foil, strips, rods, clips, plates, balls and the like. Although the invention will be particularly described with reference to the use of drawn wire as the conductor element, it should be understood that preformed conducting metal having other shapes of the type described may be used in lieu of wire.

The term "catalytic base" as used herein generically refers to any insulating material which is catalytic to the reception of electroless metal, regardless of shape or thickness and includes thin films and strips as well as thick substrata. The term "catalytic adhesive", also used herein, refers to an insulating resinous material with adhesive capability which is catalytic to the reception of electroless metal.

The catalytic bases and catalytic adhesives referred to herein are compositions which comprise an agent which is catalytic to the reception of electroless metal, i.e., an agent which is capable of causing the reduction of metal ions in an electroless metal deposition solution to metal.

The catalytic agent may be a metal selected from Groups VIII and IB of the Periodic Table of Elements, such as nickel, gold, silver, platinum, palladium rhodium, copper and iridium. Compounds of such metals, including salts and oxides thereof, may also be used.

Typical formulations for catalytic insulating adhesives and catalytic insulating bases suitable for use herein are given in U.S. Pat. Nos. 3,259,559 and 3,226,256, the specifications of which are hereby incorporated herein by reference.

Preferred catalytic agents for dissolution in, dispersion in, chemical reaction with, or complexing with inorganic or organic materials to render such material catalytic are the metals of Groups IV and VIII of the Periodic Table of Elements, or salts or oxides thereof, such as chlorides, bromides, fluorides, ethyl acetoacetates, fluoroborates, iodides, nitrates, sulfates, acetates, and oxides of such metals. Especially useful are palladium, gold, platinum, copper, palladium chloride, gold chloride, platinum chloride and copper oxide alone or in combination with stannous chloride.

The catalytic agent, depending upon type, will be present in amounts varying from a small fraction, e.g., 0.0005 to about 80%, usually between about 0.1 to 10%, based upon the combined weight of carrier material and catalyst. The particular concentration used will depend to a large extent upon the material used.

The catalytic insulating bases may be prepared by dissolving or dispersing the catalytic agent in an insulating material which may in turn be formed into a three-dimensional object, as by molding. The resulting article is catalytic throughout its interior to the reception of electroless metal, so that when holes or apertures are formed in the three-dimensional object, the surrounding walls of the holes are also catalytic. Thus, when such an article containing apertures extending below the surface is contacted with an electroless metal deposition solution, as by immersion thereon, electroless metal deposits on the walls surrounding the apertures, and can be built up to any desired thickness.

The pre-formed conductors of this invention may be encapsulated within the catalytic material prior to or during the molding operation, or could be bonded to the surface of the molded article prior to final cure or hardening.

In another embodiment, an insulating resinous material having a catalytic agent dispersed therein, or dissolved therein, or reacted or complexed therewith, is used to impregnate laminates, such as paper, wood, Fiberglas, polyester fibers and other porous materials. These base materials, for example, are immersed in the catalytic resin or the catalytic resin is sprayed onto the base material, after which the base materials are dried in an oven until all the solvent has evaporated, leaving the material of the type described impregnated with the catalytic resin. If desired, the laminates could be bonded together to form a base of any desired thickness. Here again, the pre-formed conductors could be incorporated within or bonded to the surface of the laminates.

Such a catalytic resin could be used to encapsulate shaped conductors or wire grids directly, as will be made clear hereinafter.

Alternatively, a wire grid or screen could be bonded to the surface of such a laminate.

A further alternative is to pre-form or pre-mold thin films or strips of unpolymerized resin having dissolved in or dispersed in or reacted with or complexed with a catalytic agent, and then laminate a plurality of the strips together to form a catalytic insulating base of the desired thickness. Alternatively, such strips could be used to encpasulate or "set" the shaped pre-formed conductors of this invention, or the shaped conductors could be bonded to one or more outer surfaces of such strips. In each embodiment, the interior of the insulating base will be catalytic throughout, such that, when holes or apertures are formed therein at any part, the walls of the holes or apertures will be sensitive to the reception of electroless metal from an electroless metal chemical deposition solution such as an electroless copper solution.

In making catalytic bases of the type described, wherein the catalytic agent is dissolved in the resin, it is helpful if the catalytic agent is initially dissolved in a suitable solvent prior to incorporation into the resin. The solvent may then be evaporated during curing of the resin.

In another embodiment, a solution of the catalytic agent could be used to treat an adsorbent filler to thereby impregnate the filler with a catalytic agent. The catalytic filler could then be incorporated into the base or carrier material. Typical fillers are those ordinarily used in resins and plastics. As examples may be mentioned aluminum silicate, silica gel, clay, such as kaolin, attapulgito, and the like. Alternatively, a base exchange resin or clay, including crystalline aluminosilicate, could be base exchanged with an aqueous or organic solution of a catalytic agent in the form of a salt, and the exchanged resin or clay or crystalline aluminosilicate incorporated into the resin base.

Catalytic agents of the type described could also be incorporated into a resin during its manufacture in the form, for example, of a molding powder. The molding powder could then be extruded or otherwise worked to form a plastic article which would be catalytic.

The catalytic insulating base need not be organic. Thus, it could be made of inorganic insulating materials, e.g., inorganic clays and minerals such as ceramic, ferrite, carborundum, glass, glass bonded mica, steatite and the like. Here, the catalytic agent would be added to inorganic clays or minerals prior to firing.

As already brought out, the term "catalytic" as used herein refers to an agent or material which is catalytic to the reduction of the metal cations dissolved in electroless metal deposition solutions of the type to be described.

Among the organic materials which may be used to form the preferred catalytic insulating bases and adhesives described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene co-polymers and acrylonitrile-butadienestyrene co-polymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Among the thermosetting resins may be mentioned allyl phthalate; furone; melamine-formaldehyde; phenol formaldehyde and phenol-furfural co-polymer, alone or compounded with butadiene acrylonitrile co-polymer or acrylonitrile-butadienestyrene co-polymers; polyacrylic esters; silicones; urea formaldehydes; epoxy resins; allyl resins; glyceryl phthalates; polyesters; and the like.

The catalytic adhesives will ordinarily comprise a flexible adhesive resin, alone or in combination with thermosetting resins of the type described. Typical of the flexible adhesive resins which may be used in such a system are the flexible adhesive epoxy resins, polyvinyl acetal resins, polyvinyl alcohol, polyvinyl acetate, and the like. Preferred for use as the adhesive resin are natural and synthetic rubber, such as chlorinated rubber, butadiene acrylonitrile co-polymers, and acrylic polymers and co-polymers.

The adhesive resins of the type described have appended thereto polar groups, such as nitrile, epoxide, acetal and hydroxyl groups. Such adhesive resins co-polymerize with and plasticize any thermosetting resins which may be present in the system, and alone or in combination with the thermosetting resins impart good adhesive characteristics through the action of the polar groups.

Typical examples of the catalytic bases and adhesives for use herein are given below:

EXAMPLE 1

| Butyrolactone | 60 grams |
|---|---|
| Palladium chloride | 0.1 gram |
| Concentrated (37%) hydrochloric acid | 5 drops |

The composition of this example is added to an epoxy resin-hardener system, and the system permitted to cure to form a resin base whose interior is catalytic to the reception of electroless metal.

EXAMPLE 2

| N-methyl-2-pyrrolidone | 50 grams |
|---|---|
| Palladium chloride | 0.5 gram |
| Diacetone alcohol | 450 milliliters |

Prolonged agitation is required to assure complete solution of the palladium chloride. The resulting solution may be added to a variety of thermoplastic and thermosetting resinous base materials and also used to impregnate glass cloth. Following evaporation of the solvent, the resulting bases will be found to be catalytic to the reception of electroless metal.

Other preferred embodiments of catalytic solutions which can be added to resins to produce catalytic bases include:

TABLE

Palladium chloride in tetrahydrofuran
Palladium chloride in dimethyl sulfoxide
Palladium chloride in dimethyl sulfoxide and methylene chloride
Palladium chloride in dimethyl formamide
Palladium chloride in cellosolve acetate
Palladium chloride in methylethyl ketone
Palladium chloride in xylene
Palladium chloride in acetic acid
Palladium chloride in tetrahydrofurfuryl alcohol
Palladium chloride in methylene chloride
Gold chloride in ethyl alcohol
Chloroplatinate in ethyl alcohol.

Of the catalyst solutions listed in the Table, particularly stable for long periods of time is a solution of 10% palladium chloride in a mixture of dimethyl sulfoxide and methylene chloride.

As will be clear from the foregoing, the catalyst solutions of the type described in Examples 1 and 2, and in the Table, in addition to being highly useful for addition to thermosetting or thermoplastic resin containing systems to catalyze the same, are also suitable for impregnating coating materials, such as paper and glass cloth containing resinous laminates and the like, to render such compositions catalytic. These catalytic solutions may also, for example, be used in combination with solid catalytic agents, e.g., metals and metal oxides of Groups 1 and 8, to make systems containing solid, dispersed catalytic agents more responsible to electroless metal deposition.

The catalytic insulating adhesives of this invention are used to bond layers of material together so that the interface is catalytic to electroless metal deposition. In use, the surfaces of the material to be bonded need only be immersed in or sprayed with the catalytic adhesives, following which the solvent may be evaporated as by heating, to deposit on the substrate a flexible adhesive resin containing therein the catalytic agent. Typical systems of this type are described in Examples 3 to 5.

EXAMPLE 3

A catalytic adhesive was prepared according to the following formulation:

| | Grams/Liter |
|---|---|
| Ethylene glycol monoethyl other acetate (Collosolvo acetate) | 600 |
| Epoxy resin (BRL 2256) | 109 |
| Acrylonitrile butadiene co-polymer rubber (Hycar 1312) | 20 |
| Phenolic resin (SP 103) | 20 |
| Phenolic resin (SP 126) | 20 |
| Phenolic resin (SP 6600) | 20 |
| Acrylonitrile-butadiene (Paracil CV) | 144 |
| Silicon dioxide (Cab-O-Sil) | 50 |
| Wetting agent (Igepal 430) | 17.5 |

Separate solutions of the following salts were prepared by dissolving the salts in 50 grams N-methyl-2-pyrrolidone at room temperature:
Palladium chloride
Cupric chloride
Silver nitrate
Auric chloride.

The resulting solutions were mixed with an equal part by weight of the adhesive binder. Each of the resulting adhesive resin systems may be used to bond insulating and/or conducting laminae together so as to provide a bond interface which is catalytic to the reception of electroless metal.

EXAMPLE 4

| N-methyl-2-pyrrolidone | 50 grams |
|---|---|
| Auric chloride | 1.67 grams |
| Adhesive 10 | 300 grams |

EXAMPLE 5

| N-methyl-2-pyrrolidone | 50 grams |
|---|---|
| Palladium chloride | 1 gram |
| Stannous chloride | 1.13 grams |
| Adhesive 10 | 300 grams |

EXAMPLE 6

| N-methyl-2-pyrrolidone | 40 grams |
|---|---|
| Auric chloride | 1.67 grams |
| Stannous chloride | 1.13 grams |
| Adhesive 10 | 300 grams |

In Examples 4, 5 and 6, the ingredient designated as Adhesive 10 corresponds to the following clear adhesive system:

| Methylethyl ketone | 1200 grams |
|---|---|
| Acrylonitrile-butadiene (Paracil CV) | 72 grams |
| Phenolic resin (SP 8014) | 14 grams |

The catalytic adhesive solutions of Examples 4, 5 and 6 are especially suitable for use in bonding thermoplastics.

The addition of the stannous chloride in Examples 4, 5 and 6 appears to render the systems more active and more responsive time-wise to the action of the electroless metal baths.

Typically, the autocatalytic or electroless metal deposition solutions for use with the catalytic insulating bases and adhesives described comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time, as will be made more clear hereinbelow.

Typical of such solutions are electroless copper, electroless nickel and electroless gold solutions. Such solutions are well known in the art and are capable of autocatalytically depositing the identified metals without the use of electricity.

Electroless copper solutions which may be used are described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjustor, e.g., sodium hydroxide.

Electroless nickel baths which may be used are described in Brenner, "Metal Finishing", November 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

Specific examples of electroless copper depositing baths suitable for use will now be described:

EXAMPLE 7

| | Moles/Liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil. thick in about 51 hours.

Other examples of suitable baths are as follows:

EXAMPLE 8

| | Moles/Liter |
|---|---|
| Copper sulfate | 0.02 |
| Sodium hydroxide | 0.05 |
| Sodium cyanide | 0.0002 |
| Trisodium H-hydroxyethylethylenediaminetriacetate | 0.032 |
| Formaldehyde | 0.08 |
| Water | Remainder |

This bath is preferably operated at a temperature of about 56° C., and will deposit a coating of ductilo electroless copper about 1 mil. thick in 21 hours.

EXAMPLE 9

| | Moles/Liter |
|---|---|
| Copper sulfate | 0.05 |
| Diethylenetriamine pentaacetate | 0.05 |
| Sodium borohydride | 0.009 |
| Sodium cyanide | 0.003 |
| pH | 13 |
| Temperature | 25° C. |

EXAMPLE 10

| | Moles/Liter |
|---|---|
| Copper sulfate | 0.05 |
| N-hydroxyethylethylenediaminetriacetate | 0.115 |
| Sodium cyanide | 0.0016 |
| Sodium borohydride | 0.008 |
| pH | 13 |
| Temperature | 25° C. |

Utilizing the electroless metal baths of the type described, very thin conducting metal films may be laid down. Ordinarily the metal films superimposed by electroless metal deposition will range from 0.1 to 7 mils. in thickness, with metal films having a thickness of even less than 0.1 mil. being a distinct possibility.

The accompanying drawings referred to herein and constituting a part hereof, illustrate certain embodiments of the invention and together with the specification serve to explain the principles of the invention. In the drawings, similar reference numerals refer to similar parts.

Figure 1:
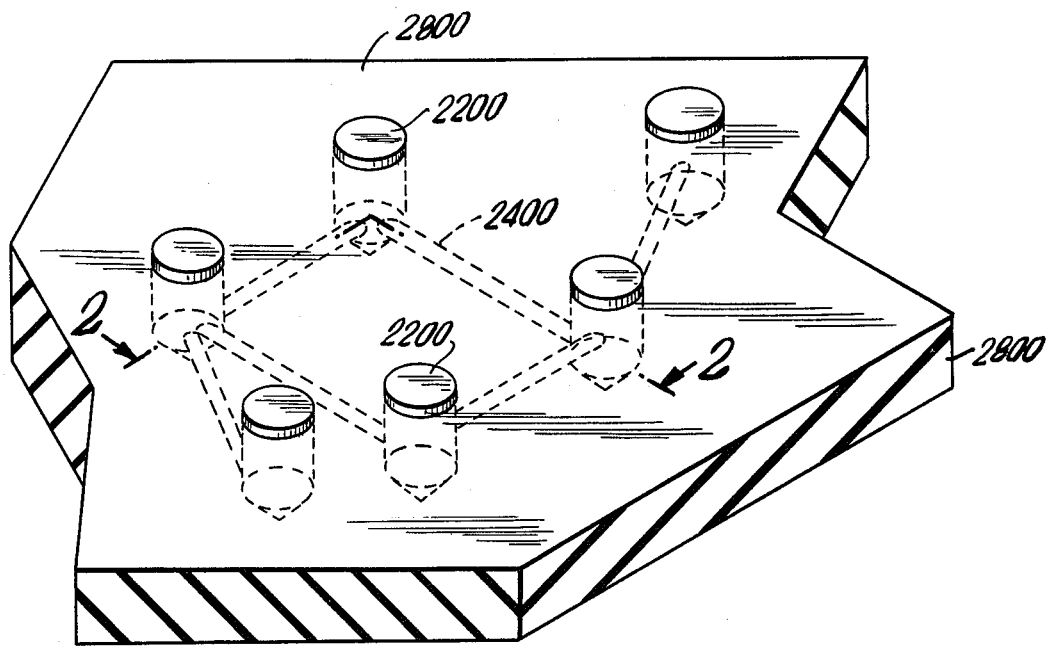
FIG. 1 is an isometric view of a prefabricated circuit board comprising shaped, integral conductors made in accordance with the teachings of this invention.

In making the circuit boards in accordance with the teachings contained herein, a wide variety of techniques may be used to lay down the shaped conductors in the desired pattern.

For example, hole centers could be provided in a catalytic base in a predetermined pattern. Then, referring to a "to-from list", wire ends are inserted into the proper terminal holes to fit the pattern. Next, a catalytic layer is superimposed over the wire pattern to hold it in place and to fill the holes. A non-registered permanent resin mask could then be superimposed on both surfaces of the resulting laminate by dipping, spraying, or the like. Using a drill, punch, or a suitable etchant, the original holes in the base could then be re-formed, removing the original wire ends in the process, and exposing new wire ends at the wall hole. Next, the board is subjected to electroless metal deposition, to plate the hole walls and form an integral bond with the wire ends.

In another embodiment, a catalytic base could be covered with an adhesive resin, partially cured, or, alternatively, with a heat or solvent activatable catalytic film. Then, using a wire dispensing stylus, wire is imbedded in the partially cured catalytic adhesive or the heat or solvent activatable catalytic film. Depending upon the film, the wire emanating from the stylus could be moistened with a suitable solvent or heated to insure adhesion or "set" to the catalytic film. Next, using encapsulation or lamination techniques, the wire pattern would be coated with a catalytic layer. Then, a non-registered mask could be superimposed on both surfaces of the laminate, after which holes would be provided to sever the wire and leave exposed ends adjacent the hole walls. In the final step, the assembly would be exposed to an electroless metal deposition solution to plate the walls surrounding the holes and form a strong, integral connection with the wire ends.

Conventional insulated wires may be used in all of the embodiments of this invention.

When conventional insulated wire is utilized, however, the insulation interferes to some extent with the growth of electroless metal on the wall of a hole in a catalytic base which contains the end of an insulated wire. Since the electroless metal grows in three directions at the wall, this need not be a serious problem. Thus, if electroless deposition is continued for a long enough time, the deposit will eventually cover both the exposed end of the conductor itself, and the insulation surrounding the conductor.

When the wires are thick, however, or when only a very thin plating is desired on the hole walls, conventional insulated wire could pose a problem and cause a discontinuity of the plating at the hole wall. Accordingly, in accordance with this invention, there are also provided insulated electrical conductors in which the insulation coating is a natural or artificial resin or plastic which is catalytic to the reception of electroless metal.

Although the electric wire assembly boards of the present invention will advantageously have plated through hole terminal interconnections, i.e., terminal interconnections formed by a process in which conductive metal is deposited on the wall of a hole, as by electroless deposition or electroplating, to thereby electrically connect the wire making up the circuitry to the exterior of the board, this invention is broad enough to encompass a wide variety of other interconnections.

For example, in one embodiment, projectiles in the form of conducting pins, preferably tapered, could be impelled at a high velocity into the boards in accordance with a program to intersect and sever the prearranged wire circuitry at predetermined points, and to make electrical contact between the resulting severed ends. This embodiment would eliminate the necessity for pre-drilling or punching holes in the board. In this embodiment, it would not be necessary to use catalytic insulating material, or to seed and sensitize non-catalytic insulating material.

Figure 2:
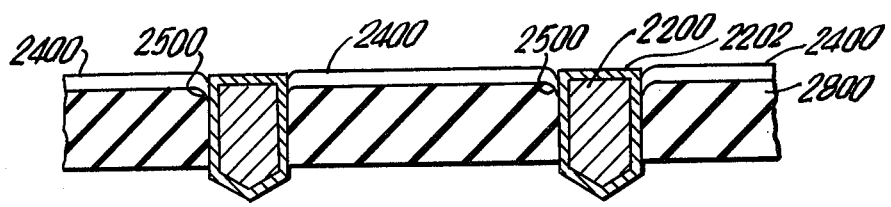
FIG. 2 is a cross-section of a circuit board similar to the circuit board shown in FIG. 1.

Such an embodiment is illustrated in FIGS. 1 and 2, wherein 2800 is an insulating base having embedded therein a wire 2400 arranged in the form of a predetermined circuit pattern. Projectile pins 2200 sever the wire 2400 and contact the wire ends 2500 to connect the ends to the exterior of the board.

Preferably the projectile pins 2200 are coated with a low melting metal, such as tin, indium, solder or the like, as shown at 2202 in FIG. 2. After the pins are impelled into the boards, the board may be subjected to a heat treating process above the melting point of the low melting metal, thereby causing the metal coating to melt and to form an integral bond between the wire end 2500 and the pin 2200. Alternatively, the wire 2400 could be coated with a low melting metal, such as tin, indium, solder and the like. It will be seen that absent such a coating of low melting metal, the pins 2200 will make wiping contact only with the wire ends 2500.

Figure 3:
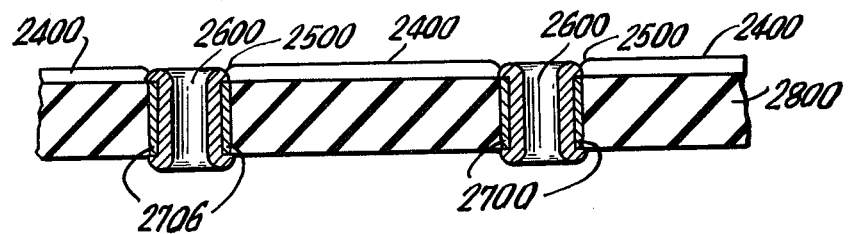
FIG. 3 is a cross-section of a circuit board similar to the circuit board in FIG. 2 but showing a modified metal terminal.

In the embodiment of FIGS. 1 and 2, it would of course be possible to provide holes at predetermined points, and to then insert the pins 2200 into the resulting holes. The pins 2200 could be either solid or hollow, and could take a wide variety of shapes, e.g., cylindrical, conical, hourglass, and the like. When hollow, the pins, if desired, could take the form of a tube eyelet, which after insertion into the pre-formed hole, could be exploded to make good contact with the severed wire ends. Such an embodiment is shown in FIG. 3, wherein 2600 represents the exploded eyelet. Here again, the eyelet could be coated with a low melting metal of the type described as shown at 2700, such that upon heating of the eyelet, the coating will melt and form an integral connection between the wire end 2500 and the eyelet. Here again, the wire 2400 could also be coated with a low melting metal. When the tublet or eyelet is hollow, the board could be dip soldered to fill the opening in the tublet or eyelet.

As will be clear from the foregoing, the mechanical terminals suitable for use in interconnecting the wire ends of the wire forming the circuit patterns in the boards of this invention make take a wide variety of forms, such as solid or hollow tubes, eyelets, pins, and the like. In a preferred embodiment, terminals and/or the wire will be coated with a low melting metal to enhance the interconnections between the wire end and the mechanical terminal.

The invention in its broader aspects is not limited to the specific steps, methods, compositions and improvements shown and described herein, but departures may be made within the scope of the accompanying claims without departing from the principles of the invention and without sacrificing its chief advantages.

What is claimed is:

1. A prefabricated electric wire assembly board comprising an insulating base having substantially parallel upper and lower surfaces, a plurality of metal conductors each performed as a continuous elongated unit independent of said base and coated with a layer of insulating material independent of said base and in the form of a predetermined circuit pattern, adhesive means bonding said conductors in fixed relationship on one of said surfaces, an aperture in said base, at least one of said plurality of metal conductors having a conductor end exposed at the wall of the base surrounding the aperture, and a metal terminal in the aperture contacting the wire end, thereby electrically connecting said one surface to the other of said surface.

2. The prefabricated wire assembly board of claim 1 wherein the metal terminal is a solid pin.

3. The prefabricated wire assembly board of claim 1 wherein the metal terminal is a hollow eyelet.

* * * * *